United States Patent [19]

Jaecklin et al.

[11] Patent Number: 4,843,449
[45] Date of Patent: Jun. 27, 1989

[54] CONTROLLABLE POWER SEMICONDUCTOR

[75] Inventors: André Jaecklin, Ennetbaden; Peter Roggwiller, Riedt-Neerach; Rudolf Veitz, Baden; Thomas Vlasak, Birr, all of Switzerland

[73] Assignee: BBC Brown Boveri AG, Baden, Switzerland

[21] Appl. No.: 152,417

[22] Filed: Feb. 4, 1988

[30] Foreign Application Priority Data

Feb. 24, 1987 [CH] Switzerland .............................. 691/87

[51] Int. Cl.[4] ............................................. H01L 29/74
[52] U.S. Cl. ......................................... 357/38; 357/20; 357/36; 357/51; 357/56
[58] Field of Search ........................ 357/20, 36, 38, 51, 357/56

[56] References Cited

FOREIGN PATENT DOCUMENTS

| 8535 | 3/1980 | European Pat. Off. |
| 1589560 | 3/1970 | Fed. Rep. of Germany . |
| 3509745 | 10/1985 | Fed. Rep. of Germany . |
| 3134074 | 8/1986 | Fed. Rep. of Germany . |
| 57-201077 | 12/1982 | Japan .................................. 357/38 G |
| 57-201078 | 12/1982 | Japan .................................. 357/38 G |
| 59-99769 | 6/1984 | Japan . |

OTHER PUBLICATIONS

A. Jaecklin et al., "Gate Turn-Off Thyristors . . . ," I.E.D.M. 1986, pp. 114–117.
T. Nagand et al., "A Snubber–Less GTO," Power Electronics Specialists Conf., Jun. 1982, Camb., Mass. pp. 1–5.

Primary Examiner—Joseph E. Clawson, Jr.
Attorney, Agent, or Firm—Oblon, Spivak, McClelland, Maier & Neustadt

[57] ABSTRACT

In a controllable power semiconductor component which consists of a plurality of parallel-connected individual elements disposed adjacently to one another, the control contacts of which are connected to a common gate, different line resistances between gate and control contacts are compensated in order to achieve a uniform loading on all individual elements.

In a GTO thyristor, the compensation is preferably achieved by adjusting the gate trough resistance ($R_G$) in the p-type base (3) between gate contact (5) and n-type emitter (2).

9 Claims, 3 Drawing Sheets

CONTROLLABLE POWER SEMICONDUCTOR

BACKGROUND OF THE INVENTION

1. Field of the Invention

The invention relates to the field of semiconductor components. In particular, it relates to a controllable power semiconductor component in which a plurality of differently doped layers are disposed between two main electrodes;

a control electrode is provided for controlling the component;

the component is subdivided into a plurality of parallelconnected individual elements disposed adjacently to one another;

a control contact is allocated to each individual element, and the control contacts of the individual elements are connected to a common gate and, together, form the control electrode.

2. Discussion of Background

Controllable power semiconductor components in the form of gate turn-off (GTO) thyristors are gaining increasing importance in power electronics because of their simplified gate drive.

Such GTO thyristors for high switching capacities typically consist of a large number (100 ... >1000) of individual elements, that is to say individual thyristors or segments, gate-driven independently of one another, which are disposed adjacently to one another and operate in parallel mode.

The current carrying capability of the total component is greatly determined by the different behavior of the individual elements. Thus, it is known, in particular, that the dissipation capacity of an elementary single thyristor can be higher by more than a power of ten than the average dissipation capacity of a larger group of individual elements (see, for example, FIG. 7 in the article by T. Nagano et al. "A snubber-less GTO"Z; Power Electronics Specialists Conf., June 1982, Cambridge/Mass., USA).

The maximum turn-off current of a GTO thyristor of a given size depends, on the one hand, on a scattering of the semiconductor characteristics on the large-are Si substrate. In this regard, the lowest possible scatter and thus a maximized turn-off current can be achieved by careful process control, for example bvy using irradiation processes for doping and adjustment of service life (see A. Jaecklin and B. Adam, "Gate turn-off thyristors with near-perfect technology", Int. Electron Devices Meeting, Los Angeles, December 1986).

On the other hand, the distribution of the firing current to all individual thyristors of a GTO component is nonuniform for geometric reasons because the resistance obtained in the feedlines constructed as coherent layer of metallization is of different magnitude in the case of individual elements having different spacing from the gate or firing connection.

In German Patent Specification No. 3,134,074, it has been proposed in the case of a GTO thyristor having individual elements arranged in concentric rings to eliminate said geometrically-induced nonuniformities in the gate drive by supplying the control current via an annular low-resistance link extending between the concentric rings of the individual elements. This link is inserted into a compound electrode plate which is in contact with the component and must be manufactured with considerable expenditure and high accuracy.

Apart from that, its effectiveness is void as soon as there are more than two concentric rings of individual elements.

In addition, this type of solution does not offer any possibility to eliminate the uneven control current distribution along an individual element itself.

SUMMARY OF THE INVENTION

The invention is based on the object of creating a controllable power semiconductor component which is capable of controlling relatively high currents by means of uniform gate drive to the individual elements without being expensive in its production.

In a power semiconductor component of the type initially mentioned the object is achieved in that means for compensating for different line resistances between the respective control contact and the gate are provided at the individual elements on the semiconductor substrate.

Whereas, therefore, different line resistances are to be avoided in advance by means of a suitable geometric arrangement in the solution hitherto known, the core of the invention consists in deliberately accepting the different line resistances but compensating them locally at the respective individual elements on the semiconductor substrate.

In this manner, the usual bonding methods can still be used since the compensation measures are restricted to a modification of the semiconductor substrate itself.

According to a preferred embodiment of the invention the component has the structure of a gate turn-off thyristor in which a p-type emitter, an n-type base, a p-type base and an n-type emitter are arranged above one another between an anode and a cathode, the individual elements are formed by finger-like areas of the n-type emitter which are surrounded by the p-type base emerging on the surface, the control contacts are applied as gate contacts in the form of a metallization on the p-type base emerging on the surface, and the means for compensating for the differences in the line resistances comprise a resistance, which changes over the area of the component, in the p-type base between the respective gate contact and the finger-like area of the n-type emitter.

BRIEF DESCRIPTION OF THE DRAWINGS

In the text which follows, the invention will be explained in greater detail with reference to illustrative embodiments in conjunction with the drawing, in which.

DESCRIPTION OF THE PREFERRED EMBODIMENTS

Figure 1:
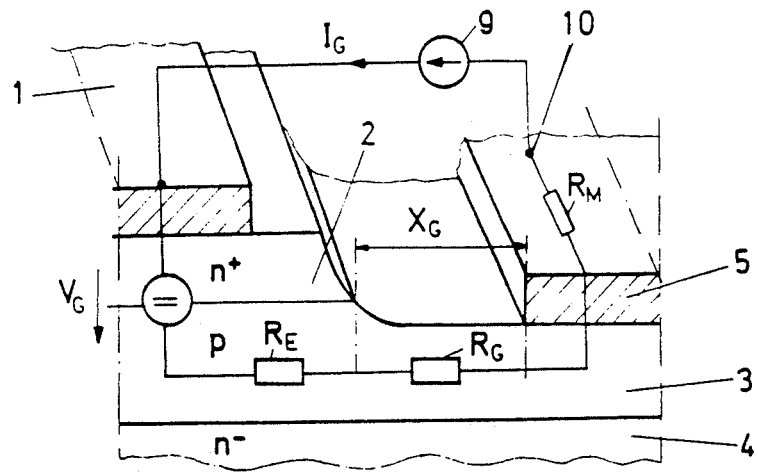
FIG. 1 shows a section of the configuration of an individual element of a GTO thyristor and the associated equivalent circuit of the control circuit.

In FIG. 1, the configuration of a GTO thyristor element is shown in section in a perspective view. For reasons of clarity, the upper three layers of the sequence of four layers arranged between an anode and a cathode, an $n^-$-dope n-base 4, a p-doped p-type base 3 and an $n^+$-doped n-type emitter 2 are shown.

The n-type emitter 2 is limited in its lateral extent to a particular area and surrounded by the p-type base 3 emerging on the surface. Then-type emitter 2 and the p-type base 3 are provided with a cathode contact 1 and gate contact 5, respectively, in the form of thin metallization. The gate contact 5 in this arrangement is restricted to the part area in which the p-type base 3 emerges on the surface.

With the appropriate external connection between the two contacts, cathode contact 1, n-type emitter 2, p-type base 3 and gate contact 5 form the firing or turn-off circuit of the GTO element via which the thyristor is both turned-on and turned-off.

During the turning-off process during which considerable currents flow in the turn-off circuit, this turnoff circuit can be described by a simple ohmic equivalent circuit drawn in FIG. 1. In this equivalent circuit, an external current source 9 drives a gate current $I_G$ through a series circuit of three resistances, a metallization resistance $R_M$ which comprises the ohmic resistance of the gate contact in parallel with the surface, a gate trough resistance $R_G$ which comprises the resistance in the p-type base 3 from the gate contact 5 to the area of the n-type emitter 2 (with a gate distance $X_G$), and an emitter resistance $R_E$ which includes the resistance of the ptype base 3 below the n-type emitter 2. In addition, a gate voltage $V_G$ is impressed across the transition between n-type emitter 2 and p-type base 3 by the anode current already flowing.

Referring to the representation of FIG. 1, it can be immediately seen that the magnitude of the metallization resistance $R_M$ depends on the point of the component at which the gate current $I_G$ is fed into the gate contact 5, that is to say the point at which the feed point 10 is located: the longer distances travelled by the gate current $I_G$ through the metallization of the gate contact 5 before it becomes effective in the interior of the semiconductor, the greater the metallization resistance $R_M$.

In the case of an individual GTO element, this already results in uneven distributions of the gate current $I_G$ along the element. These uneven distributions become particularly serious, however, when a plurality of individual elements which obtain their gate current from a common feed point is distributed over a relatively large substrate area in a high-power GTO thyristor.

Figure 2:
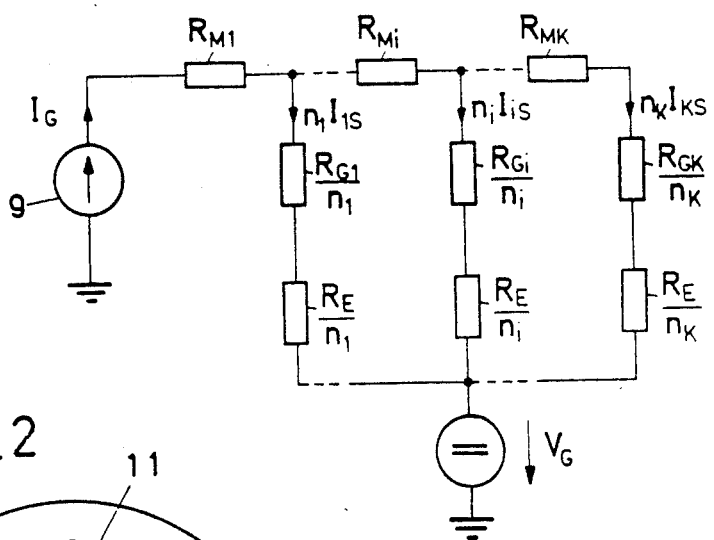
FIG. 2 shows the known arrangement of the finger-like individual elements of a GTO thyristor in concentric rings on the cathode side.

FIG. 2 shows the cathode-side view of such a largearea GTO thyristor. In this component, a plurality of individual elements 11 is disposed in two concentric rings on the round substrate disc. The individual elements 11 are surrounded on all sides by the coherent gate contact 5, consisting of a single metallization layer, which is bonded to a gate connection 8 (drawn dashed) at the center of the disc.

From the central gate connection 8 which serves as feed point for the gate current, the gate current must travel longer distances to the individual elements of the outer ring in the metallization layer of the gate contact 5 than to the closer individual elements of the inner ring.

Figure 3:
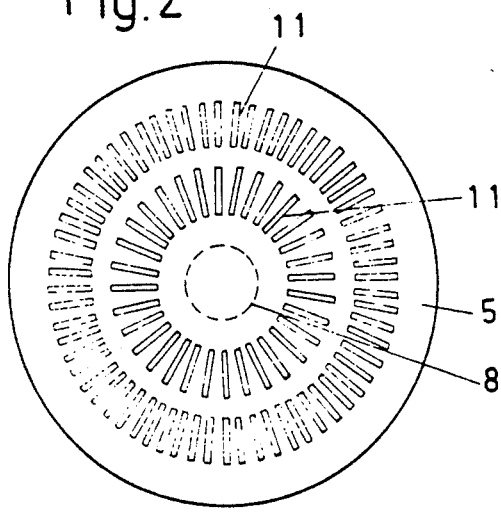
FIG. 3 shows the equivalent circuit of the control circuits belonging to an arrangement according to FIG. 2.

This circumstance finds its expression in the equivalent circuit, shown in FIG. 3, of the turn-off circuit for a GTO thyristor according to FIG. 2 having k different concentric rings of individual elements in the general case. The gate current $I_G$ from the external current source 9 flows through a first metallization resistance $R_{M1}$ which characterizes the internal resistance of the metallization between the gate connection and the first inside range and then branches, one part reaching the cathode through the $n_1$ parallel-connected individual elements of the first ring with their gate trough resistances $R_{G1}$ and emitter resistances $R_{E1}$, which are assumed to be equal (with a total intensity of $n_1 \cdot I_{1S}$; $I_{1S}$ = current through an individual element or segment in the first ring).

The other part gradually passes through further metallization resistances $R_{M2}, \ldots, R_{Mi}, \ldots, R_{MK}$ which are in each case associated with the metallization between adjacent rings. From it, a corresponding current $n_2 \cdot I_2, \ldots, n_i \cdot I_{iS}, \ldots n_k \cdot I_{kS}$, resulting from the associated numbers $n_2, \ldots, n_i, \ldots, n_k$ of the individual elements branches off for each further ring of numbers $2, \ldots, i, \ldots, k$.

The total of $$\sum_{i=1}^{k} n_i$$

individual element of the generalized GTO thyristor are therefore disposed in k different concentric rings, in which arrangement the gate trough resistance $R_{Gi}$ and emitter resistances $R_{Ei}$ should be equal for all $n_i$ individual elements of one ring.

Figure 4:
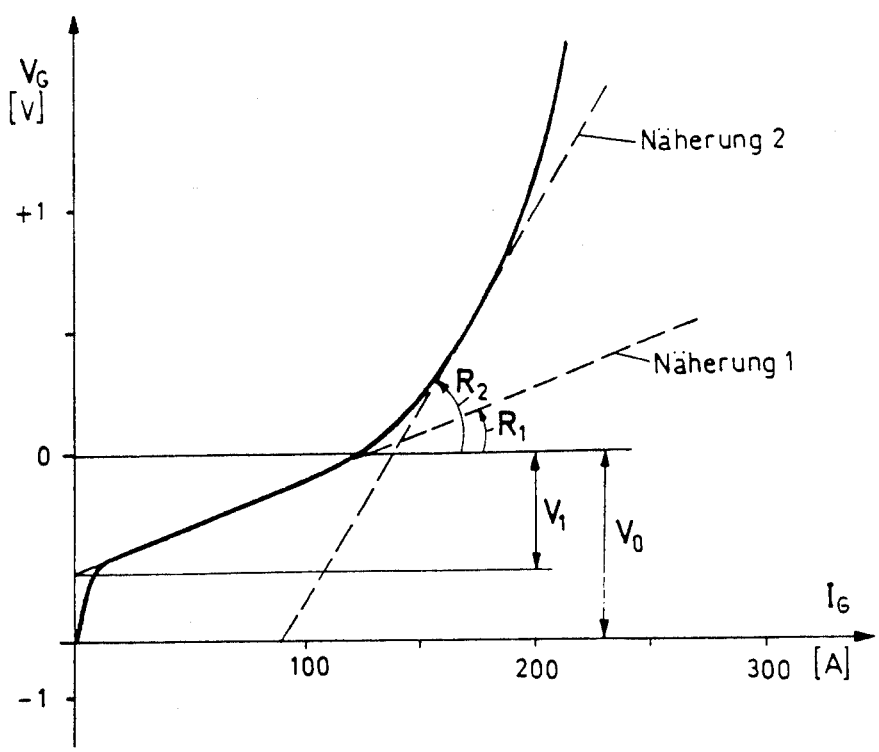
FIG. 4 shows an experimentally determined current-/voltage characteristic for the gate of a GTO thyristor.

FIG. 4 then represents an experimentally determined current/voltage characteristic for the gate circuit of such a GTO thyristor which can be considered as verification of the model specified in FIG. 3.

According to a preferred illustrative embodiment of the invention, the gate through resistances $R_{Gi}$ and emitter resistances $R_{Ei}$ are then dimensioned in such a manner that the differences in the voltage drops across the metallization are compensated. As a result, an exactly homogeneous distribution of the control currents for all individual elements or segments can be forced with a given metallization. This measure results, on the one hand, in a considerable increase in the turn-off current of the entire group of individual elements. On the other hand, it results in a considerable increase in the yield during series production because the influence of production tolerances on the operational capability of the components is reduced.

A numeric comparison of the experimentally determined resistance lines in the $V_G (I_G)$ characteristic of FIG. 4 with the equivalent circuit from FIG. 3 shows that the following holds true in the first part of the turn-off process ($V_G \lesssim 0$) for the resistance $R_1$ located there (FIG. 4; approximation 1):

$$R_1 = R_{tot} (R_{Ei} = 0).$$

This relation indicates that, with good approximation, the control current is initially, that is to say when the p-type base 3 is fully flooded with charge carriers below the n-type emitter 4, is only determined by the gate force resistances $R_{Gi}$ and the metallization resistances $R_{Mi}$ ($R_{tot}$ = total resistance).

In this case, therefore, the compensation of the metallization resistance $R_{M2}$ can be achieved by appropriate choice of $R_{Gi}$ alone ($R_{Ei} \approx 0$).

In a later phase ($V_G \gtrsim 0$; approximation 2), the effecive resistance in the gate circuit increases because the emitter resistances $R_{Ei}$ can no longer be neglected there. However, if all n-type emitter regions of the individual elements are geometrically equal, there are no differences between the emitter resistances $R_{Ei}$ of the various rings. Current distribution then remains homogeneous even in this phase if a compensation has been undertaken by suitable choice of $R_{Gi}$. Even remaining differences between the currents of the individual elements are still reduced by the emitter resistances $R_{Ei}$ being added.

In the simplest case of a GTO thyristor having two concentric rings (k=2), the compensation condition according to FIG. 3 ($I_{1S} = I_{2S}$) for a disappearing emitter resistance $R_{Ei}(=0)$ is calculated as:

$$R_{G2} = R_{G1} = n_2 R_{M2} \qquad (2)$$

Compensation conditions for larger numbers of rings can be analogously calculated. If a ring gate (as in German Patent Specification No. 3,134,074) or another type of gate drive is selected instead of the so-called central gate (gate connection 8 at the center of the rings), the equivalent circuit according to FIG. 3 can be easily modified appropriately.

Incidentally, a further measure for making the structure as insensitive to the unavoidable production tolerances as possible consists in selecting the gate trough resistances $R_{Gi}$ to be as high as possible (principle of the gate ballast resistance). Similarly, only partial compensation of the metallization resistances can already bring considerable improvement of the component.

In addition, the type of compensation described can be used not only between various individual elements but also within one individual element itself. This is because, since the resistance of the gate metallization increases with the distance from the gate connection along a segment or individual element (compare FIG. 1), it is conceivable that this effect is taken into consideration by adjusting the gate trough resistance $R_{Gi}$ continuously along the individual element by means of the relation (2).

Various methods can be considered for the technological implementation of the individual adjustment of the gate trough resistance $R_{Gi}$ which will be explained with reference to FIG. 5 in the text which follows.

In general, the layer of the n-type emitter is localized, that is to say restricted to particular, for example finger-like areas for bonding the p-type base 3 forming the gate trough resistance $R_{Gi}$. This is done either by local diffusion of the n-type emitter (planar variant) or by appropriately etching away of an initially homogeneous n+-doped layer (the result is then the structure according to FIG. 1, 5), or by a combination of the two methods.

A possible measure for changing the respective resistance in the p-type base 3, especially the gate trough resistance $R_{Gi}$, then consists in changing the distance between the edge of the gate contact metallization and the associated finger-like area of the n-type emitter 2, the gate distance $Y_G$ (FIG. 1). This can be done, for example, by means of a corresponding metallization etching mask.

Figure 5:
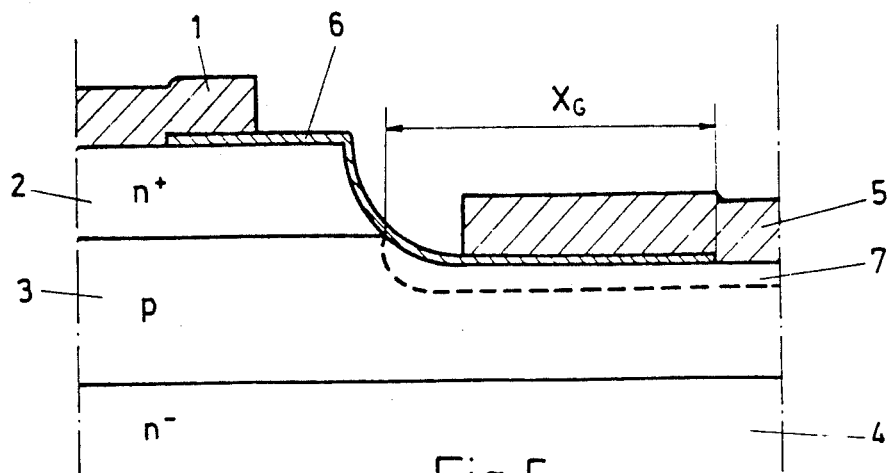
FIG. 5 shows the measures according to various illustrative embodiments of the invention for compensating different line resistances at the cross-section of an individual GTO element.

The solution represented in FIG. 5, in which, for the purpose of changing the gate trough resistance $R_{Gi}$ with a constant distance between the edge of the gate contact metallization and the associated finger-like area of the n-type emitter 2, the electrically effective distance (gate distance $X_G$ in FIG. 5) is changed by a sufficiently thick insulation layer 6 which extends under the metallization from the n-type emitter 2 and insulates the metallization from the underlying p-type base 3 up to a corresponding distance (gate distance $X_G$) is more advantageous.

This is because, in this case, the width of the metallization layer is allowed to be great so that only a small metallization resistance $R_{Mi}$ occurs as parasitic resistance. This approach can be technically achieved quite simply by means of an oxide layer ($SiO_2$) which is produced in any case during the various production processes.

Figure 6:
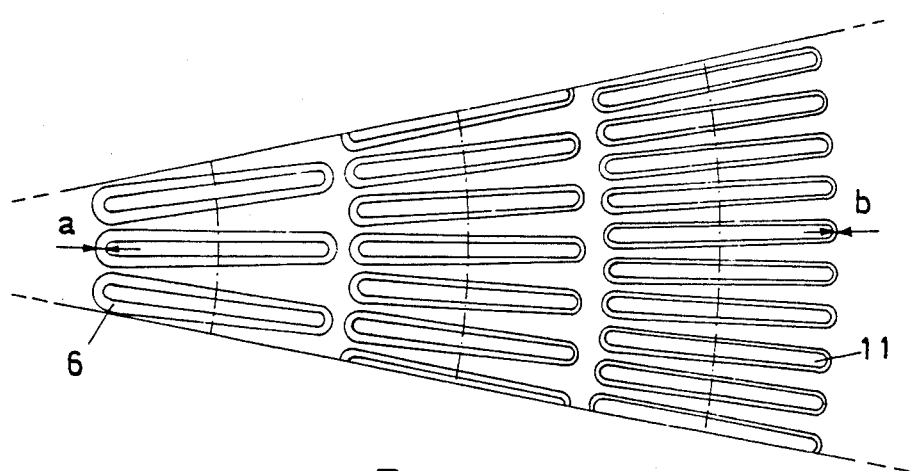
FIG. 6 shows a sector-like section of the cathode side area of a GTO thyristor according to the invention, in which the individual elements are surrounded with insulating layers of varying widths.

This type of compensation by means of an insulation layer 6 is shown by way of example in FIG. 6 for the case of a GTO thyristor having three concentric rings of individual elements 11.

In this case, the individual elements 11 (the gate metallization is not shown) are in each case surrounded by insulation layers 6, the width of which decreases in the radial direction from a maximum width a and to a minimum width b starting from the central gate.

The values of a and b can be, for example, about 150 micrometers and 50 micrometers which corresponds to a ratio of variation of 3:1.

However, a clear improvement in compensation is already obtained if all individual elements 11 are surrounded, in the sense of the previously mentioned principle of the gate ballast resistance, with an insulation layer 6 which exhibits the same width b (for example 50 micrometers) everywhere. In this context, it is decisive for the improvement that the insulation layer is made wide enough for the gate trough resistances $R_{Gi}$ to be distinctly greater than the metallization resistances $R_{Mi}$.

Figure 7:
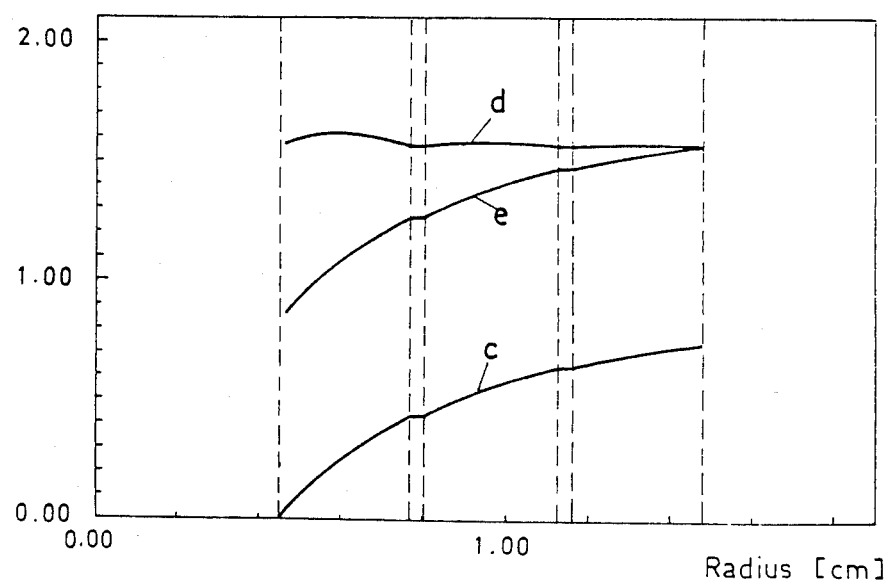
FIG. 7 shows calculated curves of the radial voltage drop for a GTO thyristor according to the prior art (c) and two embodiments of a GTO thyristor according to the invention (d, e).

The results of a model calculation in which the curves of the voltage drop against the radius have been calculated for a structure according to FIG. 6 without insulation (curve c), with an insulation layer of constant width (curve e) and with an insulation layer of varying width (curve d), reproduced in FIG. 7, show the extent of the improvements compared with the prior art.

As can be expected, the most uniform conditions occur with an insulation layer having a varying width according to FIG. 6 (curve d).

But the differences between the inner and the outer element ring are already distinctly reduced (curve e) when the insulation layer has a constant width (for example equal to 50 micometers).

In contrast, these differences are very much greater without compensation (curve c).

It is furthermore advantageous also to adjust the magnitude of the layer resistance of the p-type base 3, which is determining for the gate trough resistance $R_{Gi}$, differently for different individual elements in order to achieve a wide range of variation.

For this purpose, the p-type base 3 can be constructed to have different thicknesses in the areas in which it emerges on the surface, for example by being etched differently. However, since it is difficult to maintain narrow tolerances for the etching depth, a different doping profile in the p-type base 3 can also be used for forming a different layer resistance. In particular, a more strongly doped additional layer 7 can be inserted for this purpose (for example after the etching) in the areas of the p-type base 3 in which it emerges on the surface, as shown dashed in FIG. 5.

A component with distinctly improved electrical characteristics is obtained by adjusting the resistance of the p-type base 3, in particular the gate trough resistance $R_{Gi}$, in a compensating manner over the area of the component in the manner described.

In this context, it is naturally understood that the invention is not restricted to GTO thyristors of the examples selected but can be applied in the case of all power semicondutor components having segments distributed over an area.

What is claimed as new and desired to be secured by Letters Patent of the United States is:

1. A gate turn-off thyristor comprising:

a plurality of differently doped layers including a p-type emitter, an n-type base, a p-type base, and an n-type emitter arranged one above another in a semiconductor substrate between an anode and a cathode;

said n-type emitter comprising plural finger-like individual elements surrounded by portions of the p-base immerging on a cathode-side surface, said plural finger-like elements in association with the p-type base, n-type base and p-type emitter defining a plurality of parallel-connected individual thyristor elements;

gate contacts in the form of a metallization provided on the p-type base immerging on the cathode-side surface for controlling said thyristor;

a common gate connected to the gate contacts of each said individual thyristor elements; and means for compensating for a difference in line resistances between said common gate and the respective gate contacts of the individual thyristor elements, comprising a resistance which changes over the area of the gate turn-off thyristor in dependence on the distance of said finger element from the common gate, said resistance formed in the p-type base between the respective gate contact and the finger-like element of the n-type emitter.

2. A gate turn-off thyristor comprising:

a plurality of differently doped layers including a p-type emitter, an n-type base, a p-type base, and an n-type emitter arranged one above another in a semiconductor substrate between an anode and a cathode;

said n-type emitter comprising plural finger-like individual elements surrounded by portions of the p-base immerging on a cathode-side surface, said plural finger-like elements in association with the p-type base, n-type base and p-type emitter defining a plurality of parallel-connected individual thyristor elements;

gate contacts in the form of a metallization provided on the p-type base immerging on the cathode-side surface for controlling said thyristor;

a common gate connected tos claimed in

3. The gate turn-off thyristor as claimed in claim 1, wherein (a) the individual elements of the n-type emitter are radially disposed in a plurality of concentric circles and (b) the common gate is disposed at the center of theses circles or annularly between these circles in the form of a gate connection.

4. The gate turn-off thyristor as claimed in claim 1, wherein the distance between the edge of the gate contact metallization and the associated finger-like element of the n-type emitter is adjusted for adjusting the respective resistance in the p-type base.

5. The gate turn-off thyristor as claimed in claim 1, wherein, for the purpose of adjusting the respective resistance in the p-type base with a constant distance between the edge of the gate contact metallization and the associated fingerlike element of the n-type emitter, the electrically effective distance is adjusted by an insulation layer which extends under the metallization from the finger-like element and insulates the metallization from the underlying p-type base up to a corresponding distance.

6. The gate turn-of thyristor as claimed in claim 4 or 5, wherein the layer resistance of the p-type base is adjusted differently for different individual of the finger elements, and/or the layer resistance of the p-type base varies locally along an individual element.

7. The gate turn-off thyristor as claimed in claim 6, wherein, for the purpose of adjusting the different layer resistance, the p-type base is of different thickness in the areas in which it emerges on the surface.

8. The gate turn-off thyristor as claimed in claim 6, wherein, for the purpose of adjusting the different layer resistance, the p-type base exhibits a different doping profile.

9. The gate turn-off thyristor as claimed in claim 8, wherein, for the purpose of reducing the layer resistance, a more strongly doped additional layer is inserted into the p-type base in the portions in which it emerges on the surface.

* * * * *